(12) United States Patent
Kikkawa

(10) Patent No.: US 6,781,645 B2
(45) Date of Patent: Aug. 24, 2004

(54) ACTIVE MATRIX LIQUID CRYSTAL DISPLAY DEVICE

(75) Inventor: Hironori Kikkawa, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 9 days.

(21) Appl. No.: 09/829,991

(22) Filed: Apr. 11, 2001

(65) Prior Publication Data

US 2001/0011985 A1 Aug. 9, 2001

Related U.S. Application Data

(62) Division of application No. 09/207,207, filed on Dec. 8, 1998.

(30) Foreign Application Priority Data

Dec. 8, 1997 (JP) ............................................... 9-337275

(51) Int. Cl.[7] ............................................ G02F 1/1333
(52) U.S. Cl. ........................................ 349/44; 349/141
(58) Field of Search ........................... 349/44, 110, 106, 349/123, 141, 96, 155

(56) References Cited

U.S. PATENT DOCUMENTS

| | | | |
|---|---|---|---|
| 4,723,838 A | | 2/1988 | Aoki et al. |
| 4,789,223 A | | 12/1988 | Kasahara et al. |
| 5,767,936 A | | 6/1998 | Sugimura |
| 5,892,562 A | * | 4/1999 | Yamazaki et al. ......... 349/141 |
| 5,907,379 A | * | 5/1999 | Kim et al. ................... 349/141 |
| 6,064,460 A | * | 5/2000 | Ohta et al. ................... 349/141 |
| 6,198,520 B1 | * | 3/2001 | Kondo et al. ............... 349/141 |
| 6,271,903 B1 | * | 8/2001 | Shin et al. ................... 349/110 |
| 6,278,427 B1 | * | 8/2001 | Matsumoto et al. .......... 345/88 |
| 6,297,867 B1 | * | 10/2001 | Miyahara et al. ........... 349/141 |
| 6,509,948 B2 | * | 1/2003 | Suzuki ....................... 349/155 |
| 6,577,295 B2 | * | 6/2003 | Kikkawa ....................... 345/92 |

FOREIGN PATENT DOCUMENTS

| | | |
|---|---|---|
| JP | 4-104227 | 4/1992 |
| JP | 6-18868 | 1/1994 |
| JP | 7-239480 | 9/1995 |
| JP | H07-239480 | 9/1995 |
| JP | 8-248387 | 9/1996 |
| JP | 9-15650 | 1/1997 |
| JP | 9-80415 | 3/1997 |
| JP | H09-080415 | 3/1997 |
| JP | 9-105953 | 4/1997 |
| JP | H09-120061 | 5/1997 |
| JP | 97-034188 | 9/1997 |
| JP | H09-269504 | 10/1997 |
| JP | H10-206867 | 8/1998 |

* cited by examiner

Primary Examiner—Tarifur R. Chowdhuri
Assistant Examiner—Thoi V. Duong
(74) Attorney, Agent, or Firm—Sughrue Mion, PLLC

(57) ABSTRACT

An active matrix LCD device includes a pixel element for defining a pixel area and having a TFT and a pixel electrode disposed in association with a portion of a common electrode. The common electrode encircles the pixel area for shielding the electric field from the black matrix, thereby preventing a stray electric field from entering the pixel area and degrading the image quality.

15 Claims, 13 Drawing Sheets

ACTIVE MATRIX LIQUID CRYSTAL DISPLAY DEVICE

This is a divisional of application Ser. No. 09/207,207 (Confirmation Number not yet assigned) filed Dec. 8, 1998, the disclosure of which is incorporated herein by reference.

BACKGROUND OF THE INVENTION (a) Field of the Invention

The present invention relates to an active matrix liquid crystal display (LCD) device, and more particularly, to an active matrix LCD device wherein liquid crystal is driven by an electric field acting in the direction substantially parallel to the substrates.

(b) Description of the Related Art

LCD devices are generally categorized into two types including a passive matrix LCD device and an active matrix LCD device based on the driving system therefor. The active matrix LCD device includes an active drive element such as thin film transistor (TFT) or diode in each pixel element, for charging a capacitor thereof with a signal voltage while selecting the pixel element for an on-state in a time-division scheme. The capacitor holds the signal voltage during a subsequent off-state of the drive element for displaying an image for the pixel. Compared to the passive matrix LCD device wherein the signal voltage is applied to the liquid crystal (LC) by using a time-division matrix-drive scheme, the active matrix LCD features a higher contrast and a larger screen.

A twisted-nematic mode (referred to as TN mode, hereinafter) has been generally used as the operational mode of the LC in the active matrix LCD device, wherein the aligned direction (referred to as director, hereinafter) of the longer axes of the LC molecules is twisted by about 90 degrees between the transparent substrates, using an electric field in the direction perpendicular to the substrates for rotating the director in the vertical direction.

The TN mode LCD device generally has a defect wherein the view angle for the LCD panel is narrow, that is, the image on the LCD panel has a large view angle dependency, especially in the case of a large screen LCD panel.

For solving the problem view angle dependency, an in-plane switching mode (referred to as IPS mode, hereinafter) has been developed for generating an electric field in the direction parallel to the substrates for rotating the director within the horizontal plane. In the proposed IPS mode LCD, the horizontal alignment of the LC orientation effected by the electric field acting parallel to the substrates affords an advantage in that the double refraction characteristic of the LC is scarcely changed even if the viewpoint is moved, thereby achieving a wider view angle compared to the TN mode LCD device.

FIG. 1 shows a top plan view of a first conventional example of IPS mode active matrix LCD devices, FIGS. 2 and 3 show sectional views taken along line II—II and III—III, respectively, in FIG. 1, and FIG. 4 shows a timing chart of the potentials of electrodes and lines in the first conventional active matrix LCD device.

The first conventional LCD device has a plurality of pixel elements each including a TFT 16 and a pixel electrode 17, a plurality of scanning lines 13 disposed for respective rows of the pixel elements, a plurality of signal lines 14 disposed for respective columns of the pixel elements, and a common electrode 15, which are formed on a transparent insulating substrate 11 (referred to as TFT substrate, hereinafter). Each pixel electrode 17 and a corresponding portion the common electrode 15 extend parallel to each other to generate an electric field 100 having a main component extending substantially perpendicular to the stripe electrodes 17 and 15.

As shown in FIG. 3, the active matrix LCD device further includes a transparent counter substrate 12 disposed in opposed relationship with the TFT substrate 11 with an intervention of a LC layer 18. The counter substrate 12 mounts thereon a black matrix 19, a color filter 20 and a LC orientation layer 21 on respective sides thereof.

In the IPS mode LCD device of FIG. 1, the electric field generated therein includes unnecessary components between the signal line 14 and adjacent electrodes, which necessitates a light shield for covering the unnecessary image component. In the illustrated LCD device, the black mat 19 formed on the counter substrate 12 acts as the shield layer for the space between the signal line 14 and the adjacent electrodes (such as common electrode 15). The arrangement of the TFT substrate 11 with respect to the counter substrate 12 generally involves an alignment error of about 7 to 10 $\mu$m after bonding thereof. For assuring the effective light shield, the edge of the black matrix 19 should be located with a margin, such as designated by reference numeral 200 in FIG. 3, from the edge of the common electrode 15. This causes a larger area of the black matrix 19 and a smaller opening rate of the pixel area in the LCD device. Patent publication JP-A-9-80415 proposes for solving the problem low opening rate.

FIG. 5 shows a top plan view of the proposed LCD device, or second conventional LCD device, FIG. 6 shows a sectional view taken along line VI—VI in FIG. 5, and FIG. 7 shows a timing chart in the second conventional LCD device.

In the second conventional LCD device shown in FIG. 5, the signal line 14 partly overlaps with the common electrode 15 as viewed in the direction perpendicular to the substrates. This affords an advantage in that the portions of the black matrix 19 extending in the direction parallel to the signal lines 14 can be omitted together with their margins, and it is sufficient that the black matrix 19 has a portion extending parallel to the scanning lines 13 in the display panel. This achieves a larger opening rate of the pixel area in the LCD device.

In the second conventional LCD devices, however, the black matrix 19 formed on the counter substrate 12 involves another problem, as described hereinafter.

In case of the TN mode active matrix LCD device, since the electric field from the black matrix 19 is shielded by the transparent common electrode 15 formed on the substantially entire surface of the counter substrate 12, the electric potential of the black matrix 19 does not affect the image quality on the LCD panel. However, in case of the IPS mode active matrix LCD device, since the black matrix 19 does not have a shield electrode such as the common electrode between the black matrix 19 and the LC layer 18 in the TN mode active matrix LCD device, the potential of the black matrix 19 fluctuates and thereby affects the image quality on the LCD panel.

It is first noted that the electric potential of the black matrix 19 is not fixed in the IPS mode active matrix LCD device, whereas the black matrix 19 is implemented by materials of a high electric conductivity, such as black resist wherein a metal or carbon black is dispersed. Thus, the potential of the black matrix 19 is generally determined based on the capacitive coupling acting between the same and the signal lines 14, the scanning lines 13 and the common electrode 15

Assuming that the potential of the black matrix 19, the voltages of the signal lines 14, the scanning lines 13, and the common electrode 15, the coupling capacitances between the black matrix 19 and the signal line 14, between the black matrix 19 and the scanning line 13, between the black matrix 19 and the common electrode 15 are represented by Vbm, Vd, Vg, Vcom, Cbm-d, Cbm-g, Cbm-com, respectively, the potential Vbm of the black matrix is expressed by equations 1 and 2:

$$Vbm=Vd \times Cbm\text{-}d/Ctotal + Vg \times Cbm\text{-}g/Ctotal + Vcom \times Cbm\text{-}com/Ctotal \quad (1)$$

$$Ctotal=Cbm\text{-}d+Cbm\text{-}g+Cbm\text{-}com \quad (2)$$

Voltage Vg of the scanning line 13 is higher than signal voltage Vd of the signal line 14 and the voltage of the pixel electrode 17 during the selected small time interval when the TFT is turned on by voltage Vg of the scanning line 13, and is lower than voltage Vd and the voltage of the pixel electrode 17 during the remaining time interval.

Voltage Vd of the signal line 14 changes at an interval of the horizontal scanning cycle to charge the pixel electrodes selected in succession to a desired voltage. Voltage Vcom of the common electrode 15 also changes at an interval similar to the interval of voltage Vd or keeps a constant voltage, depending on the drive system in the LCD device. Thus, it will be understood from the equations (1) and (2) that the black matrix has a potential different from the potential of the common electrode and changes at a different interval.

The potential of the black matrix 19 deteriorates the image quality as follows. The desired electric field 100 generated between the pixel electrode 17 and the common electrode 15 reverses its polarity at a small time interval such as frame interval to prevent a defective image such as burning or stain on the display panel by preventing localization of impurity ions or charge-up of the insulator.

In the conventional LCD devices shown in FIGS. 1 and 5, the potential of the black matrix 19 is different from the potential of the pixel electrode 17 and the potential of the common electrode 15, and changes at a different time interval. This causes that a deleterious stray electric fields 101 and 102 act in the pixel area 300, which deteriorates the image quality on the display panel. In addition, the different timing and magnitude of the electric fields causes an effective DC component in the electric field in the display panel, which generates burning or stain on the panel.

Referring to FIG. 4 showing results of simulation, wherein a voltage of 5 volts is applied between the pixel electrode 17 and the common electrode 15, assuming that 480 scanning lines 13 are provided in the LCD device with a dot-inversion drive system wherein pixel electrodes in the adjacent pixels have opposite potential polarities with respect to the common electrode. Voltage Vg of the scanning lines 13 is 21 volts and −8 volts during an on-state and an off-state thereof, respectively, voltage Vd of the signal lines 14 is 12 volts and 2 volts during a positive voltage frame peirod and a negative voltage frame period, respectively, and voltage Vcom of the common electrode 15 is fixed at 6 volts.

When the scanning line 13 is off, voltage of the pixel electrode 17 falls below voltage Vd of the signal line 14 due to the charge in the TFT channel flowing into the pixel electrode 17 and to the coupling capacitance between the scanning line 13 and the pixel electrode 17. The voltage difference between the pixel electrode 17 and the signal line 14 is about 1 volt in the simulation, which causes the voltage difference between the pixel electrode 17 and the common electrode at 5 about volts. The black matrix 19 is disposed to cover the signal lines 14 and the scanning lines 13, and had an initial potential of zero volt.

As understood from of FIG. 4, potential Vbm of the black matrix 19 fluctuates around about 3V during the time interval when the pixel electrode 17 maintains off voltage. The electric field generated by potential Vbm of the black matrix 19 enters the pixel area due to the arrangement of the black matrix 19.

In FIG. 1, electric fields 101 and 102 generated by the potential of the black matrix 19 are also illustrated. In the positive voltage frame period, as shown in FIG. 4, voltage Vcom of the common electrode 15 is 6 volts, voltage of the pixel electrode 17 is 11 volts, voltage Vbm of the black matrix 19 is about 3 volts. Thus, a potential difference of 5 volts is generated between the common electrode 15 and the pixel electrode 17, and generates the desired parallel electric field 100. A potential difference of about 3 volts is also generated between the black matrix 19 and the common electrode 15 in the vicinity of the black matrix 19 to generate electric field 101. A potential difference of about 8 volts is further generated between the black matrix 19 and the pixel electrode 17 to generate electric field 102.

Electric fields 101 and 102 other than the desired parallel electric field 100 generated in the vicinity of the black matrix 19 degrade the image quality in the display panel. In a negative voltage frame period, a potential difference of 5 volts having a polarity opposite to the polarity in the positive voltage frame period is generated between the common electrode 15 and the pixel electrode 17, to generate the desired parallel electric field 100. In the vicinity of the black matrix 19, however, a potential difference of about 3 volts having a polarity similar to that in the positive voltage frame period is also generated between the black matrix 19 and the common electrode 15 to generate electric field 101. The electric field having the same polarity both in the positive voltage frame period and in the negative voltage frame period means an effective DC bias voltage being applied to the black matrix 19. The effective DC bias voltage causes a defect such as burning or stain to deteriorate the image quality in the display panel.

FIG. 7 shows results of simulation in the second conventional LCD device, with conditions similar to those in the simulation shown in FIG. 4. In the simulation of FIG. 7, the absence of a portion of the black matrix 19 overlapping the signal lines 14 causes a smaller capacitance Cbm-d between the black matrix 19 and the signal line 14 expressed in equations (1) and (2). Thus, voltage Vbm of the black matrix 19 is scarcely affected by voltage Vd of the signal lines 14. Since voltage Vd of the signal lines 14 in root-mean-square value is substantially equal to voltage Vcom of the common electrode 15, a larger difference is generated between voltage Vbm of the black matrix 19 and voltage Vcom of the common electrode 15.

Accordingly, electric field 101 generated between the black matrix 19 and the pixel electrode 17 as well as electric field 102 generated between the black matrix 19 and the common electrode 15 is larger in this case and generates a larger DC component compared to the first conventional LCD device.

In short, in the conventional IPS mode active matrix LCD devices, the potential of the black matrix 19 formed on the counter substrate 12 generates undesired electric fields in the display panel to degrade the image quality thereon.

SUMMARY OF THE INVENTION

It is therefore an object of the present invention to provide an IPS mode active matrix LCD device capable of providing a high image quality by suppressing the undesired electric fields.

The present invention provides an active matrix LCD device comprising first and second transparent substrates, liquid crystal sandwiched between the first transparent substrate and the second transparent substrate, the first transparent substrate including a plurality of pixel elements arranged in a matrix, each of the pixel elements defining a pixel area for image display and having a thin film transistor (TFT) and a pixel electrode connected to a drain of the TFT, a plurality of scanning lines each connected to gates of the TFTs in a corresponding row of the pixel elements, a plurality of signal lines each connected to a source of the TFTs in a corresponding column of the pixel elements, and a common electrode having an electrode portion disposed for each of the pixel elements in association with the pixel electrode, one of the first transparent substrate and the second transparent substrate including a black matrix for covering an area other than the pixel area as viewed in a first direction perpendicular to the first and second substrates, the electrode portion of the common electrode encircling the pixel area as viewed in the first direction.

In accordance with the active matrix LCD device of the present invention, the pixel area is shielded by the common electrode encircling the pixel area against a stray electric field from the black matrix, thereby improving the image quality of the active matrix LCD device.

The above and other objects, features and advantages of the present invention will be more apparent from the following description, referring to the accompanying drawings.

PREFERRED EMBODIMENTS OF THE INVENTION

Figure 1:
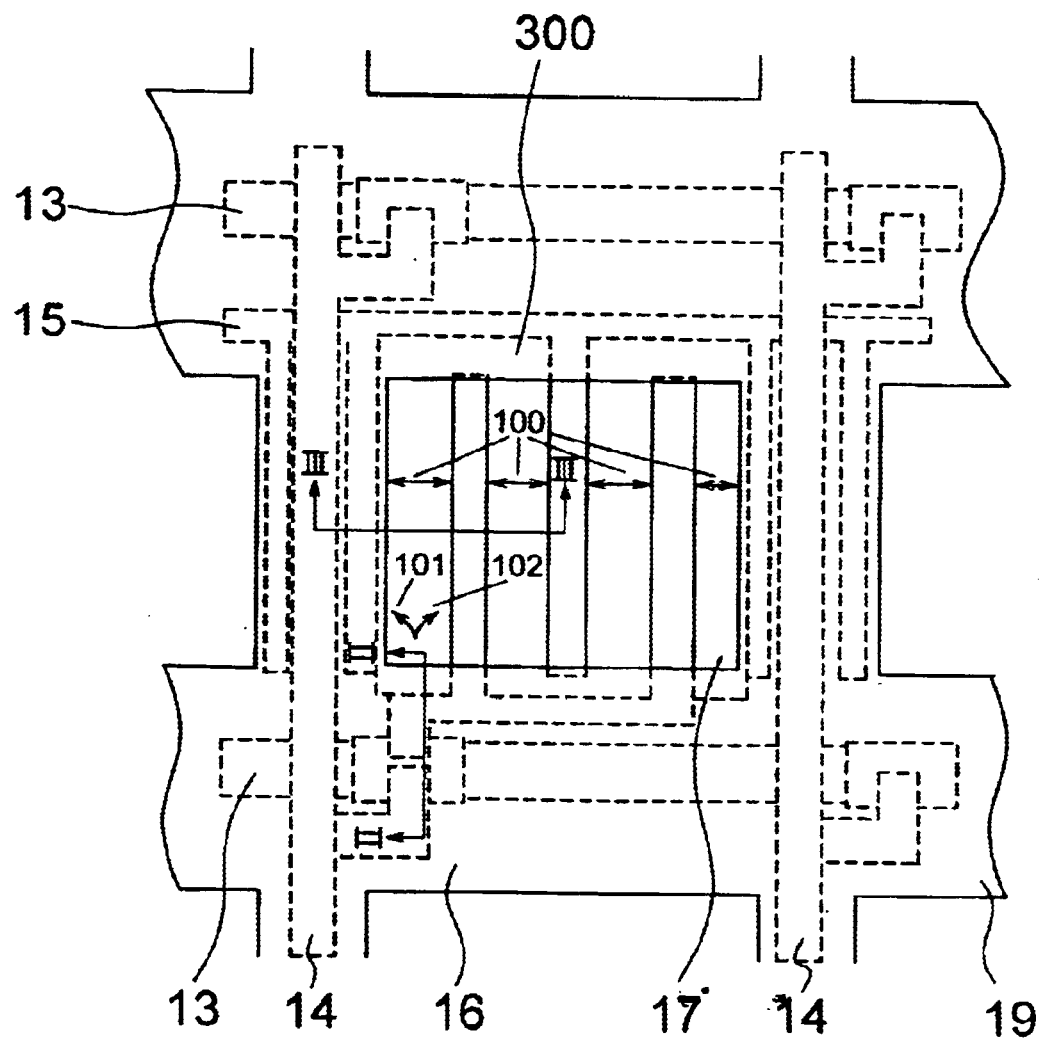
FIG. 1 is a top plan view of a conventional active matrix LCD device.
Figure 2:
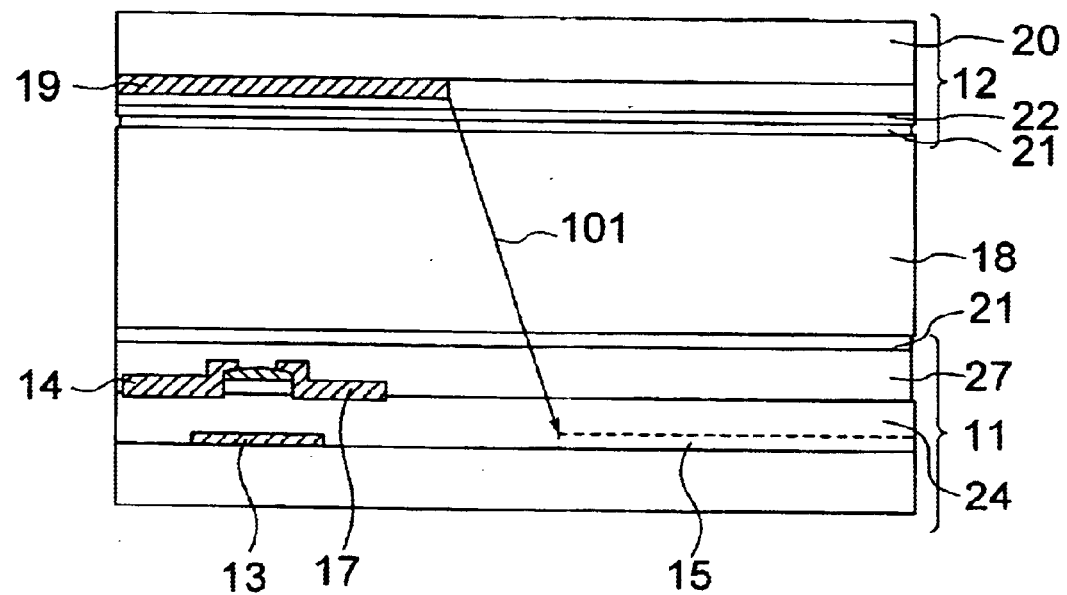
FIG. 2 is a sectional view taken along line II—II in FIG. 1.
Figure 3:
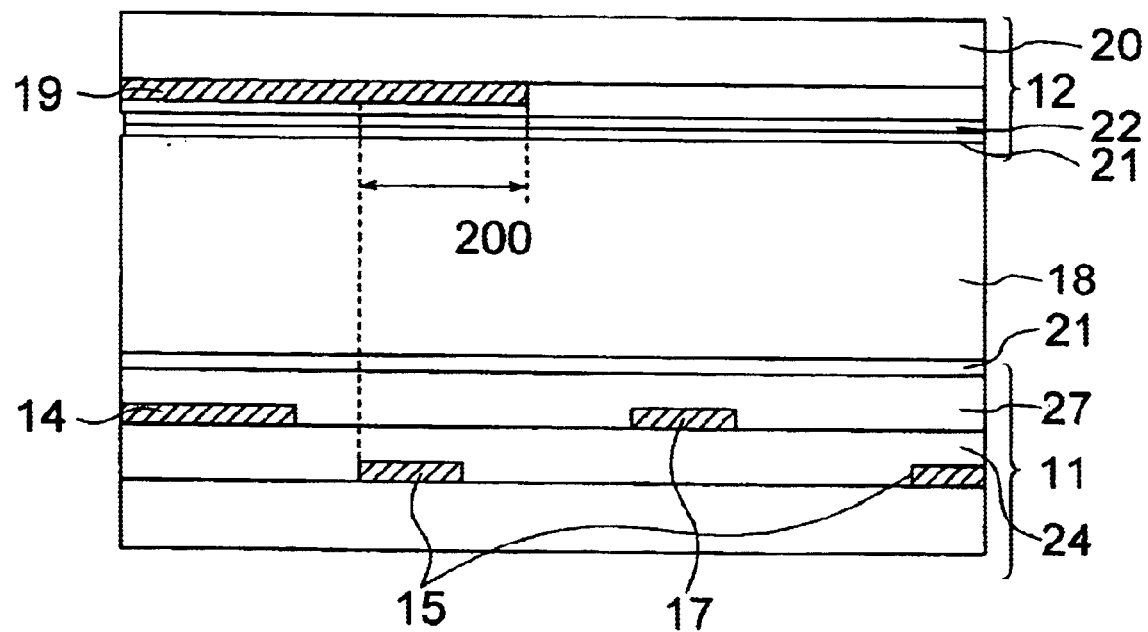
FIG. 3 is a sectional view taken along line III—III in FIG. 1.

Now, the present invention is more specifically described with reference to accompanying drawings, wherein similar constituent elements are designated by similar reference numerals throughout the drawings.

Embodiment 1

Figure 8:
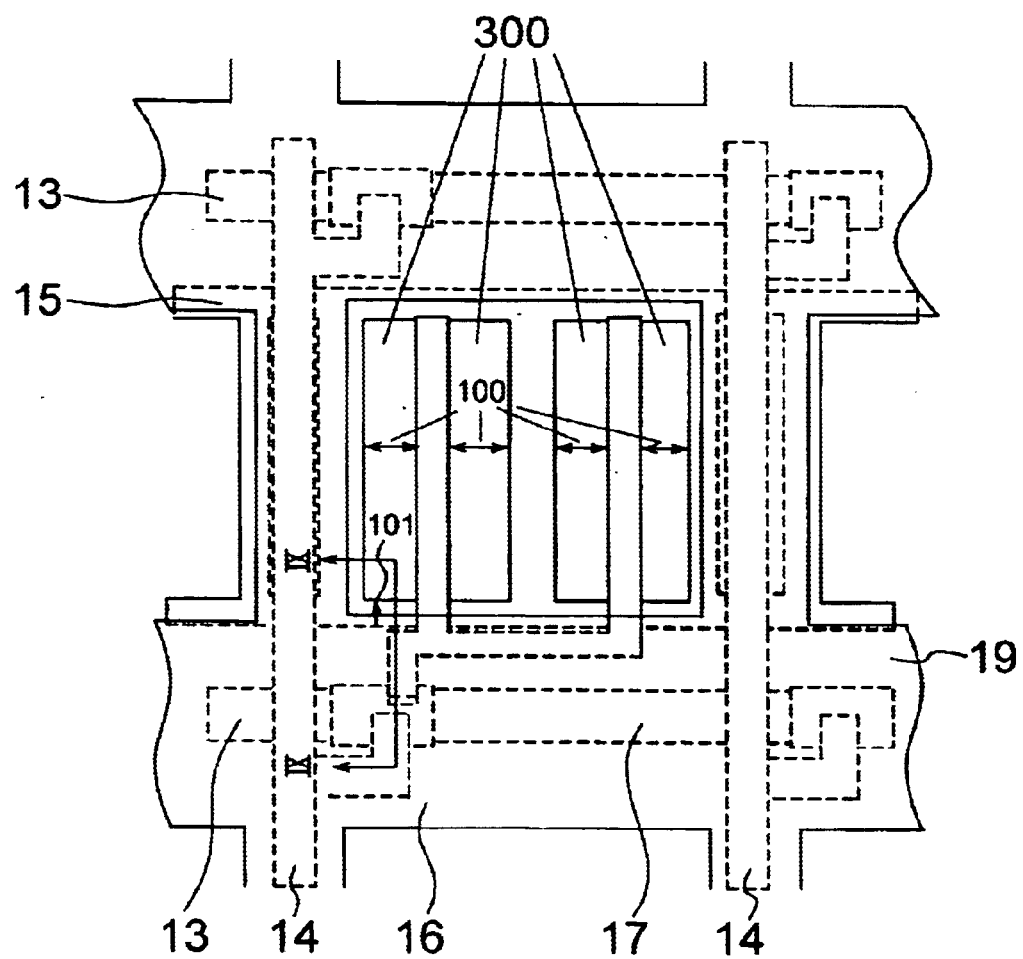
FIG. 8 is a top plan view of an active matrix LCD device according to a first embodiment of the present invention.
Figure 9:
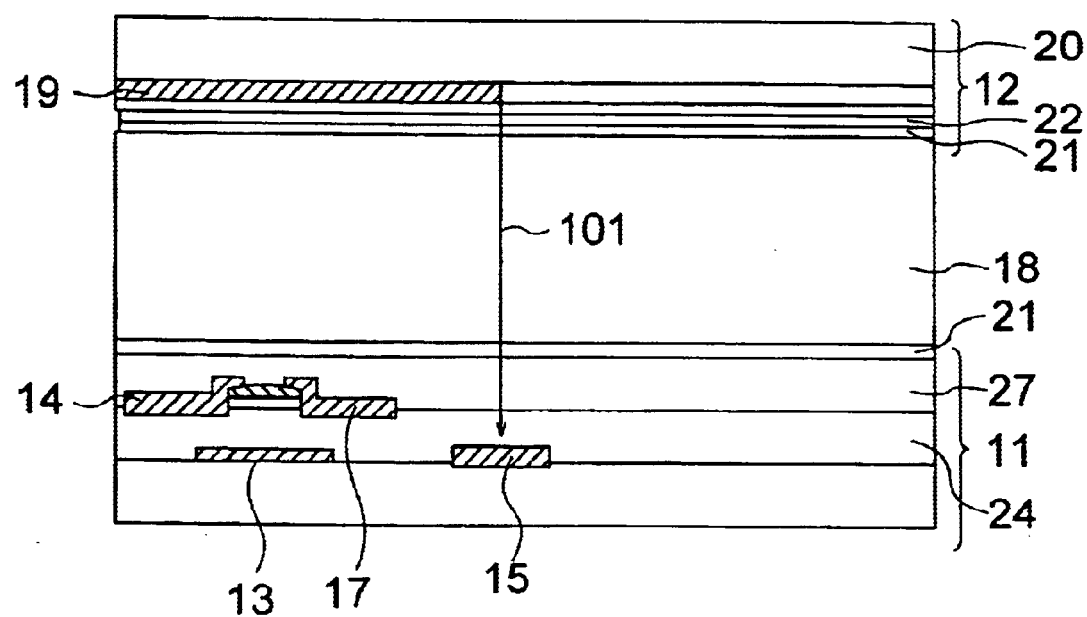
FIG. 9 is a sectional view taken along line IX—IX in FIG. 8.

Referring to FIGS. 8 and 9, an active matrix LCD device according to a first embodiment of the present invention includes a TFT substrate 11 and a counter substrate 12 opposed to each other to sandwich therebetween a LC layer 18. The TFT substrate 11 includes a plurality pixel elements each having a TFT 16 and a pixel electrode 17 connected to the drain of the corresponding TFT 16, a plurality of scanning lines 13 each connected to the gates of the TFTs 16 in a corresponding row of the pixel elements, a plurality of signal lines 14 each connected to the sources of the TFTs 16 in a corresponding column of the pixel elements, and a common electrode 15 having a common electrode portion for each of the pixel elements.

The common electrode portion extends the outer periphery of the pixel area of each pixel element and encircles the pixel area. The common electrode portion also has a central stripe passing the center of the pixel area. The pixel electrode 17 has a pair of vertical stripe portions extending parallel to the central stripe of the common electrode 15, and a horizontal stripe portion outside the pixel area for extending parallel to the bottom stripe of the common electrode 15. Each of the stripe portions of the pixel electrode 17 extends from the bottom stripe to enter the pixel area after passing the bottom stripe of the common electrode 15.

The LCD also includes a black matrix 19 disposed on the counter substrate 12 outside the pixel area for covering and extending parallel to the signal lines 14 and the scanning lines 13. The black matrix 19 also covers an outer periphery of common electrode portion of the common electrode 15 encircling each pixel area and exposes the inner periphery of the common electrode portion. That is, the edge of the black matrix is substantially aligned with the center of the peripheral portion of the common electrode 15 encircling the pixel area.

The counter substrate 12 further has a color filter 20 for color image display and an overcoat layer 22, consecutively formed on the black matrix 19. The TFT substrate 11 and the counter substrate 12 sandwich therebetween the LC layer 18 and associated orientation films 21.

In fabrication of the LCD of FIG. 8, the scanning lines 13 and the common electrode 15 both made of chrome are first formed on the TFT substrate 11. A gate insulator film 24 made of silicon oxide, an amorphous silicon (a-Si) layer and a n+type a-Si layer are then formed on the scanning lines 13 and the common electrode 15, followed by patterning to form the signal lines 14 and the pixel electrodes 17. The stripes of the pixel electrode 17 and the vertical stripes of the common electrode 15 are disposed parallel to each other in the pixel area, as shown in FIG. 8, to generate an electric field 100 having a main component extending parallel to the substrates and perpendicular to the both electrodes 17 and 15 in the pixel area.

Another chrome film is formed on the counter substrate 12, followed by patterning thereof to form the black matrix 19, for covering substantially all over, the area other than the pixel area. A color filter 20 is formed thereon using the three photolithographic steps for a polyimide based layer, made by dispersing R-G-B pigments in a photosensitive polymer. The overcoat layer 22 is then form by spin-coating and subsequent patterning of polyimide. The overcoat layer 22 prevents impurity ions eluted from the color filter 20 from being mixed into the LC layer 18. The overcoat layer 22 also functions for flattening the surface of the counter substrate 12, controlling the thickness of the LC layer 18, and suppressing disclination, so as to obtain an excellent image quality.

The orientation layers 21 made of polyimide are then formed on the inner surfaces of the TFT substrate 11 and the counter substrate 12. After rubbing process of both the orientation layers 21, polymer beads having a diameter corresponding to the gap between the substrates 11 and 12 are scattered, followed by bonding the substrates 11 and 12 in opposed relationship, with the nematic LC layer 18 disposed therebetween. A pair of polarizing plates (not shown) are then disposed for sandwiching therebetween the substrates 11 and 12, with the polarizing axis of one of the polarizing plates being aligned with the orientation of the nematic LC layer 18 and with the polarizing axis of the other of the polarizing plates being normal to the orientation.

Figure 10:
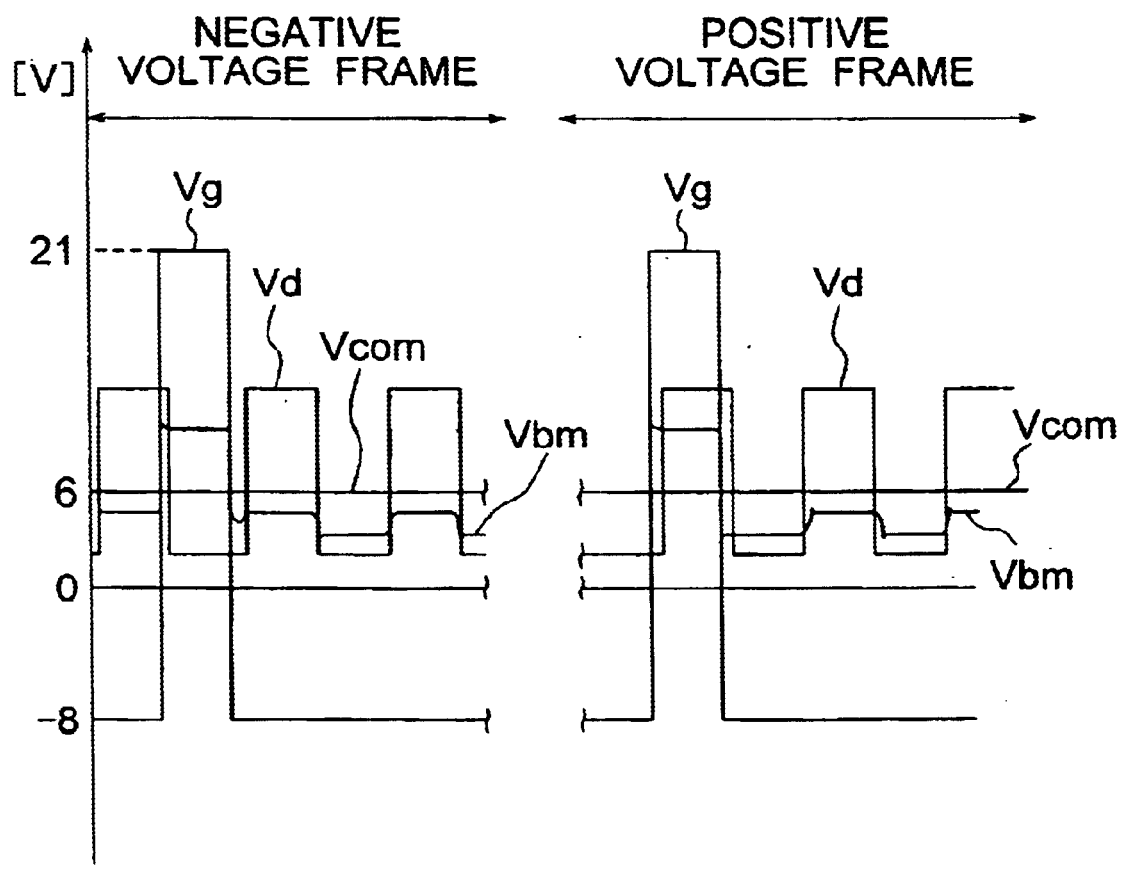
FIG. 10 is a timing chat of the potentials in the LCD device of FIG. 8.

FIG. 10 shows results of simulation for the first embodiment, wherein it is assumed that 480 scanning lines 13 are provided in the LCD device driven by a dot-inversion drive system, and a potential difference between the pixel electrode 17 and the common electrode 15 is 5 volts. In FIG. 10, each voltage of the electrodes is calculated for the case that voltage Vd of the scanning line 13 is 21 volts in an on-state and −8 volts in an off-state thereof, voltage Vd of the signal line 14 is 12 volts in a positive voltage frame period and 2 volts in a negative voltage frame period, and voltage Vcom of the common electrode 15 is fixed at 6 volts.

When voltage Vg of the scanning line 13 is turned off, the charge in the TFT channel flows into the pixel electrode 17, and the voltage of the pixel electrode 17 fluctuates due to the charge as well as the coupling capacitance between the scanning lines 13 and the pixel electrode 17, which cause a voltage fall of the pixel electrode. The voltage fall causes the voltage of the pixel electrode to be about 1 volt lower than voltage Vd of the signal line 14, which results in a voltage difference of about 5 volts between the voltage of the pixel electrode 17 and voltage Vcom of the common electrode 15.

Figure 4:
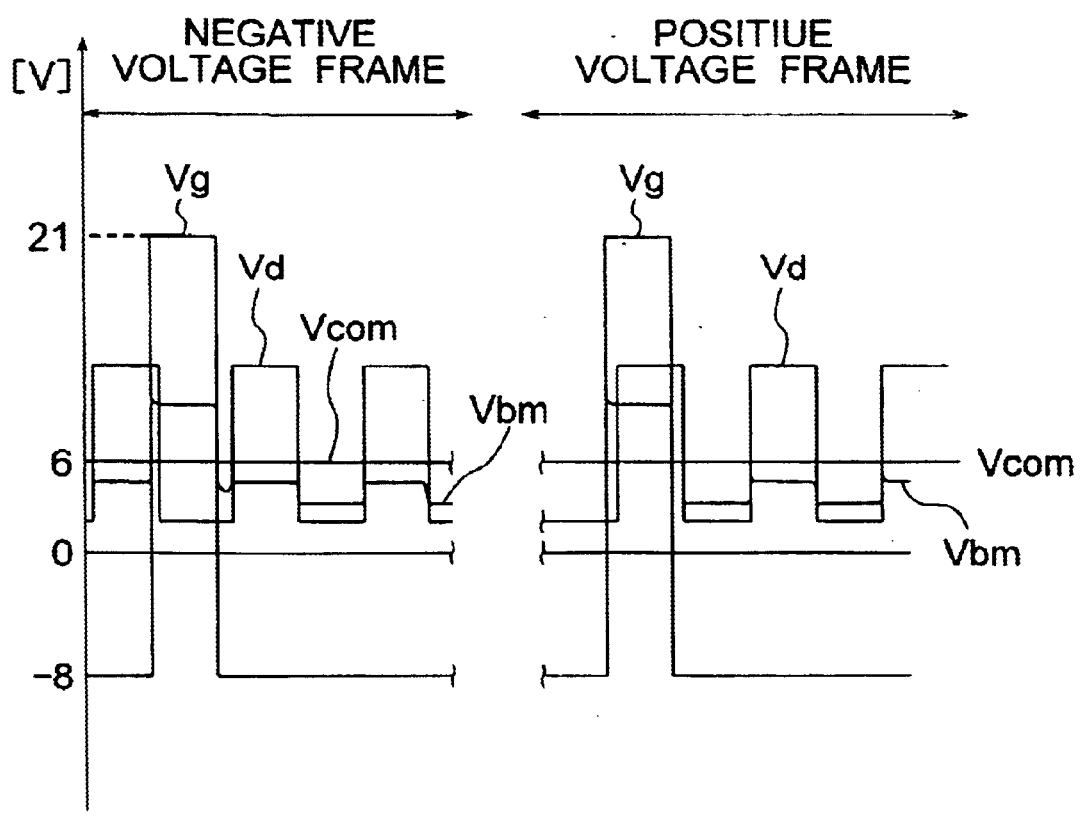
FIG. 4 is a timing chart of potentials in the LCD device of FIG. 1.
Figure 5:
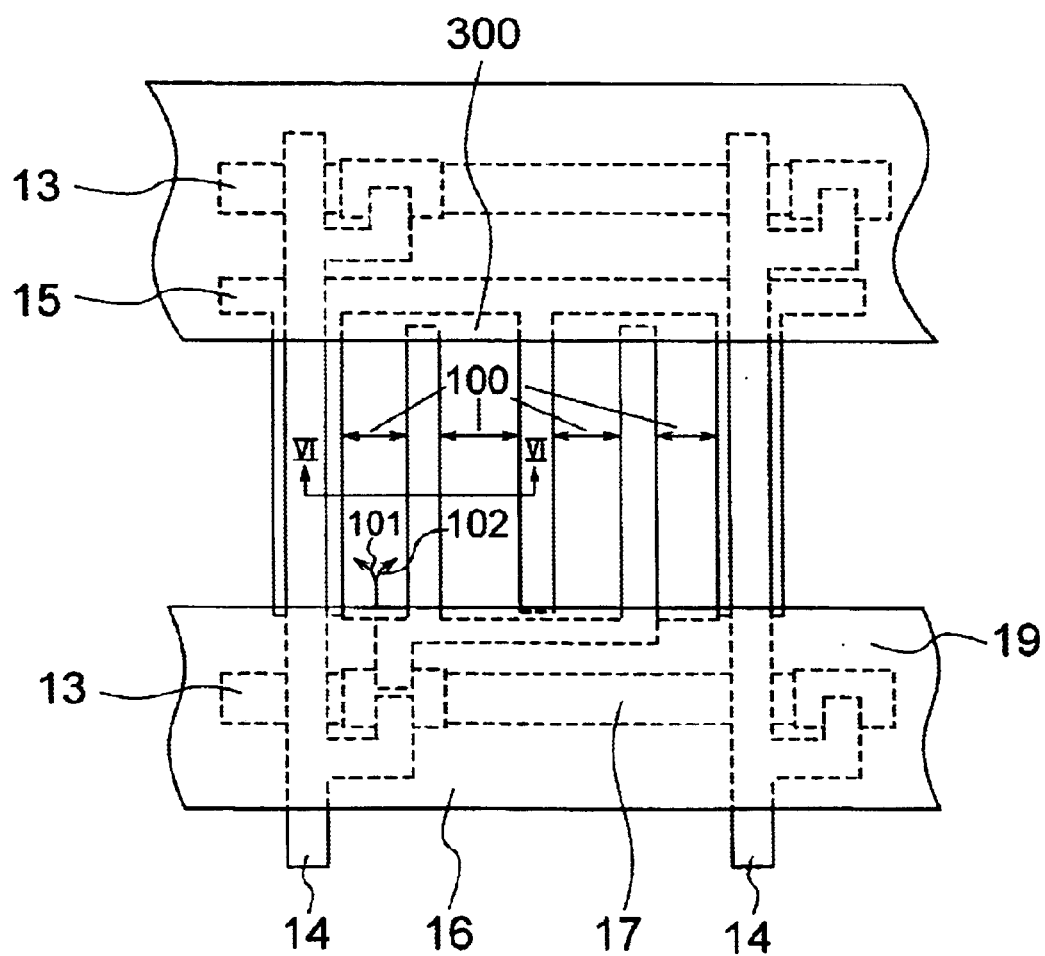
FIG. 5 is a top plan view of another conventional active matrix LCD device.
Figure 6:
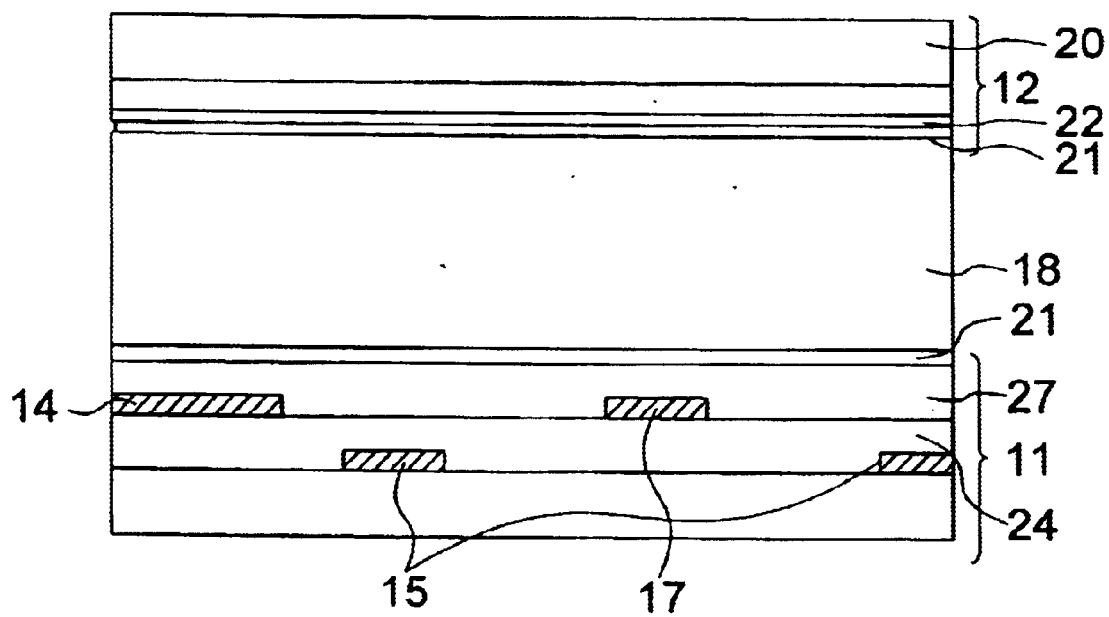
FIG. 6 is a sectional view taken along line VI—VI in FIG. 5.
Figure 7:
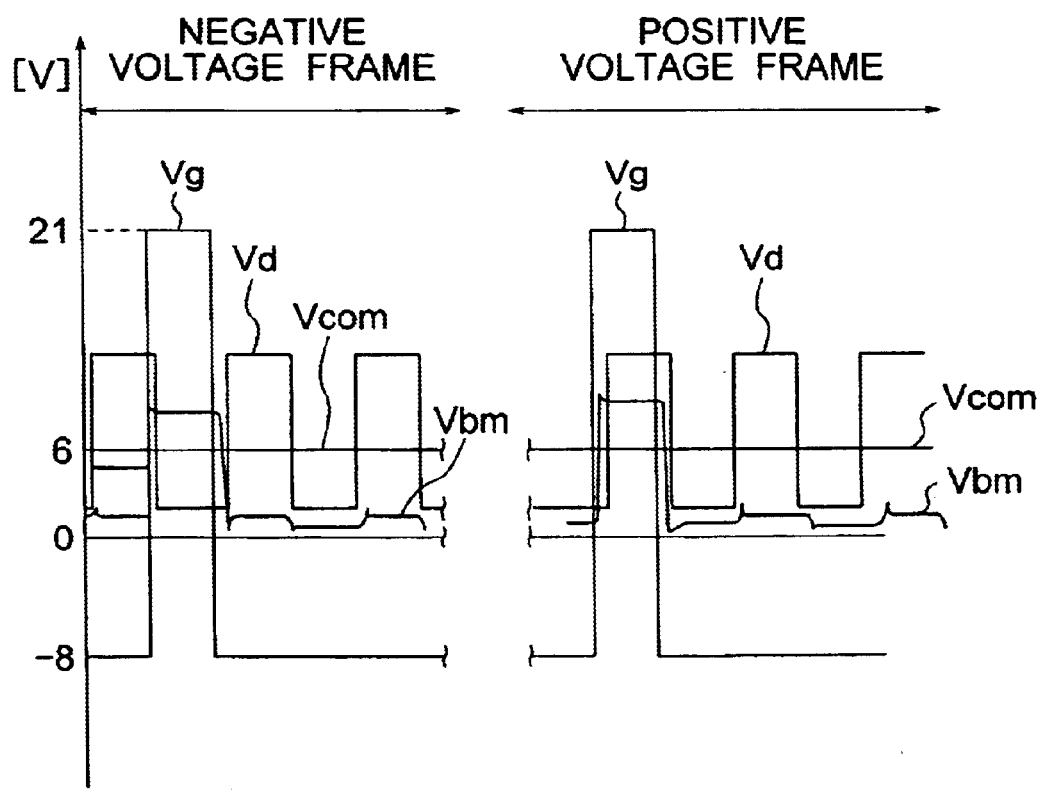
FIG. 7 is a timing chart of potentials in the LCD device of FIG. 5.

The potential itself of the black matrix 19 shown in FIG. 10 is similar to that shown in FIG. 4. However, in the structure of the present embodiment; the electric field from the black matrix 19 is substantially entirely directed toward the adjacent common electrode 15, thereby preventing the stray electric field entering the pixel area. As a result, the defect such as burning and stain observed in the conventional LCD device is not generated in the display panel of the LCD device of the present embodiment.

As described above in the present embodiment, the pixel electrode 17 has a pair of stripe portions extending parallel to the vertical stripes of the common electrode 15 in the pixel area. However, the shape and the direction are not limited thereto, so long as the common electrode 15 encircles the pixel area for shielding the pixel area against the electric field from the black matrix 19. Moreover, the material for the lines or electrodes 13, 14, 15 and 17 may be any low resistivity material such as aluminum and molybdenum.

Embodiment 2

Figure 11:
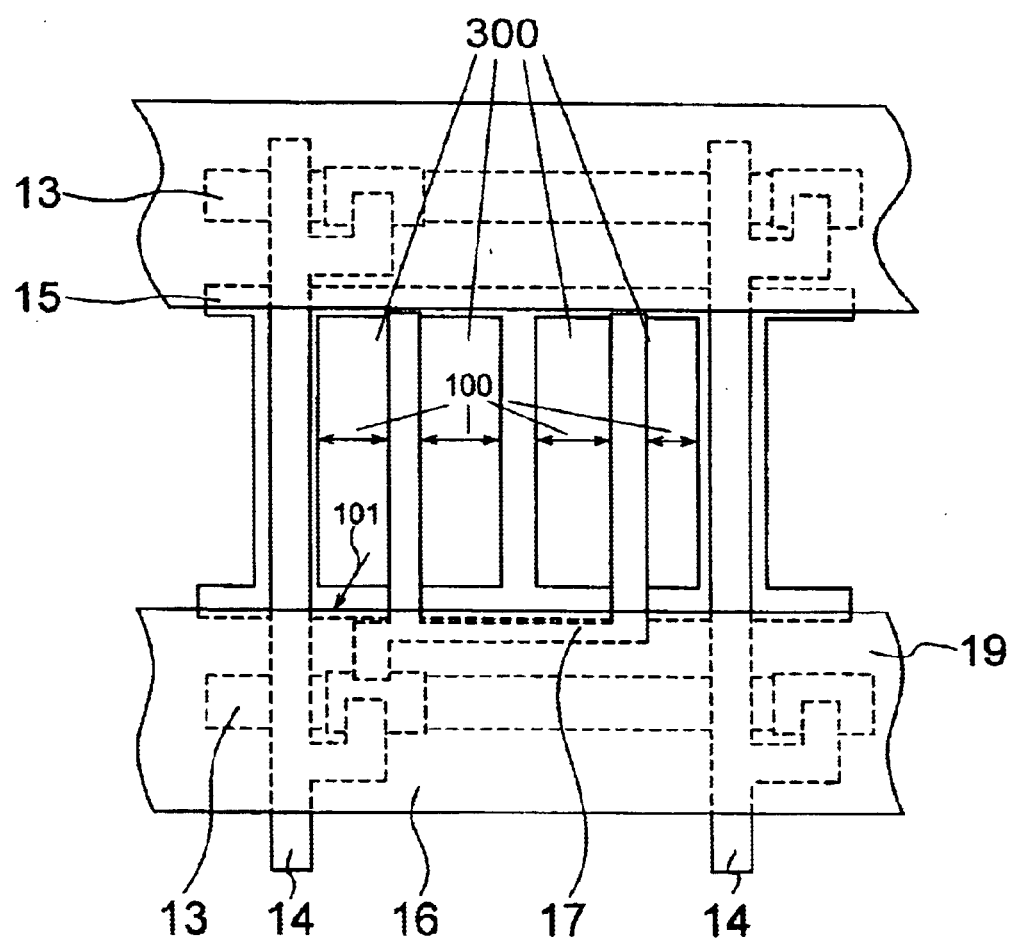
FIG. 11 is top a plan view of an active matrix LCD device according to a second embodiment of the present invention.

Referring to FIG. 11, an active matrix LCD device according to a second embodiment is similar to the first embodiment, except for the black matrix 19, which extends only in the horizontal direction, and the configuration of the common electrode 15 having a wide vertical portion, which substantially covers the signal lines 14 instead of the black matrix 19.

Figure 12:
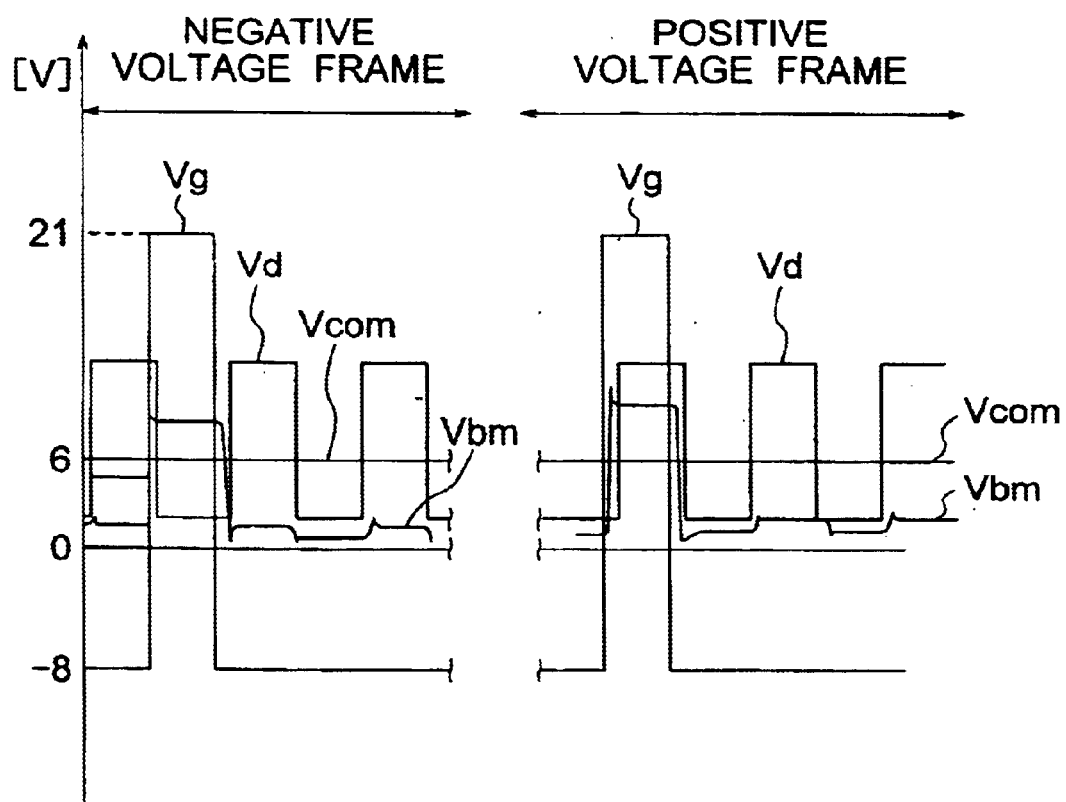
FIG. 12 is a timing chart of potentials in the LCD device of FIG. 11.

Referring to FIG. 12, voltage Vbm of the black matrix 19 is lowered compared to the first embodiment, due to the lower coupling capacitance Cbm-d between the black mat 19 and the signal lines 14. The voltage Vd of the signal line 14 in its root-mean-square value is substantially equal to voltage Vcom of the common electrode 15, which means that the difference between voltage Vbm of the black matrix 19 and voltage Vcom of the common electrode 15 is larger compared to the first embodiment. However, the electric field 101 from the black matrix 19 is substantially directed toward the adjacent common electrode 15 and the stray electric field does not enter the pixel area.

The absence of the portions of the black matrix 19 adjacent to the signal lines 14 provides an advantage in that a less alignment margin is needed for arrangement of the substrates, which assures a large opening ratio of the pixel area.

Embodiment 3

Figure 13:
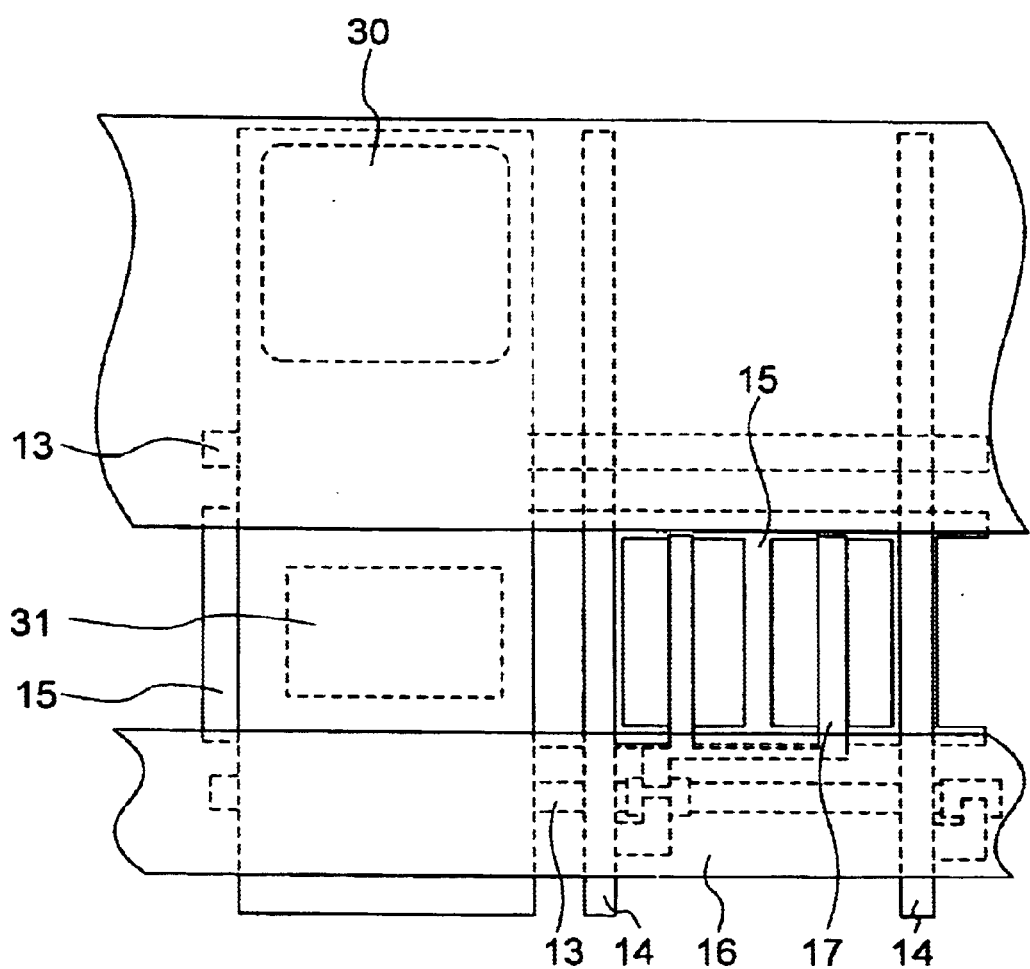
FIG. 13 is a top plan view of an active matrix LCD device according to a third embodiment of the present invention.

Referring to FIG. 13, an active matrix LCD device according to a third embodiment of the present invention is similar to the first embodiment except that the black matrix 19 is electrically connected to the common electrode 15 via a plurality of coupling sections 30, which are provided at the outer periphery of the display panel. The black matrix 19 also has a portion extending along the outer periphery of the display panel corresponding to the coupling section 30. The coupling section 30 can be formed together with other the contact 31, by selectively etching the gate insulator (such as 24 shown in FIG. 9), passivation film (such as 27 shown in FIG. 9) and orientation film (such as 21 shown in FIG. 9) to form through-holes for exposing portions of the common electrode 15, and by filling the through-holes with a conductive material. Before coupling both substrates 11 and 12, a silver paste is used for electrically connecting the conductive material to the black matrix 19. In the third embodiment, the stray electric field from the black matrix 19 does not enter the pixel area due to the equipotential of the black matrix 19 and the common electrode 15.

Since the above embodiments are described only for examples, the present invention is not limited to the above embodiments and various modifications or alterations can be easily made therefrom by those skilled in the art without departing from the scope of the present invention. For example, the black matrix may be formed on the TFT substrate.

What is claimed is:

1. A method of fabricating an LCD device having a common electrode, a plurality of scanning lines, a gate insulating film, a plurality of signal lines, a plurality of pixel electrodes and a plurality of pixel areas formed on a first substrate, comprising:

patterning a black matrix on a second substrate; and
   disposing liquid crystal between said first substrate and said second substrate, wherein said black matrix covers an area other than said pixel area and said common electrode electrically shields said pixel area from a voltage of said black matrix, and said black matrix overlaps first portions of said signal lines and said common electrode overlaps portions other than said first portions of said signal lines.

2. The method of claim 1, further comprising forming a film on said second substrate and patterning said film to form said black matrix.

3. The method of claim 2, wherein said step of forming a film comprises forming a chrome film on said second substrate and patterning said chrome film to form said black matrix.

4. The method of claim 1, further comprising:
   forming a color filter on said second substrate; and
   forming an overcoat layer on said color filter.

5. The method of claim 4, wherein said forming a color filter comprises using a plurality of photolithographic steps for a polyimide based layer.

6. The method of claim 5, wherein said photolithographic steps comprise dispersing RGB pigments in a photosensitive polymer.

7. The method of claim 4, wherein said overcoat layer substantially eliminates impurity ion migration-into said liquid crystal, flattens a surface of said second substrate and controls a thickness of said liquid crystal.

8. The method of claim 1, further comprising positioning a plurality of polarizing plates for sandwiching said first substrate and said second substrate between said polarizing plates.

9. The method of claim 1, further comprising forming said common electrode and said plurality of scanning lines of chrome.

10. The method of claim 1, wherein forming said gate insulating film comprises silicon oxide, an amorphous silicon layer and a N+ type amorphous silicon layer formed on said scanning lines and common electrodes.

11. The method of claim 1, further comprising configuring horizontal and vertical stripes of said plurality of pixel electrodes and vertical stripes of said common electrode to generate an electrical field having a main component extending parallel to said first substrate and said second substrate and perpendicular to said pixel electrodes and said common electrode in said pixel areas.

12. The method of claim 11, wherein said pixel electrode stripes are formed parallel to said common electrode vertical stripes.

13. The method of claim 1, further comprising forming orientation layers between a surface of each of said first and second substrates and said liquid crystal, said forming process comprising a rubbing process.

14. The method of claim 13, said disposing step comprising:

scattering polymer beads having a diameter substantially equal to a gap between said first substrate and said second substrate; and bonding said first substrate to said second substrate, wherein said liquid crystal is disposed between said first substrate and said second substrate.

15. The method of claim 1, further comprising positioning first and second polarization plates at respective first and second substrates, wherein a polarization axis of said first polarization plate is aligned in an orientation of the liquid crystal and a polarization axis of said second polarization plate is aligned normal to said orientation of said liquid crystal.

* * * * *